United States Patent [19]

Sheng et al.

[11] Patent Number: 4,493,942
[45] Date of Patent: Jan. 15, 1985

[54] SOLAR CELL WITH TWO-DIMENSIONAL REFLECTING DIFFRACTION GRATING

[75] Inventors: Ping Sheng, Skillman; Robert S. Stepleman, Scotch Plains, both of N.J.

[73] Assignee: Exxon Research and Engineering Co., Florham Park, N.J.

[21] Appl. No.: 458,885

[22] Filed: Jan. 18, 1983

[51] Int. Cl.³ .................................... H01L 31/04
[52] U.S. Cl. .................................. 136/259; 136/258
[58] Field of Search ................... 136/259, 258 AM; 357/30

[56] References Cited

U.S. PATENT DOCUMENTS 4,398,056   8/1983   Sheng ............................. 136/259

OTHER PUBLICATIONS

J. Müller, "Thin Silicon Film p–i–n Photodiodes with Internal Reflection", *IEEE Trans. Electron Devices*, vol. ED-25, pp. 247–253 (1978).

*Primary Examiner*—Aaron Weisstuch
*Attorney, Agent, or Firm*—Ronald D. Hantman

[57] ABSTRACT

A solar cell which includes a thin layer of active material bounded on the side toward the incident light with an antireflection coating and bounded on the other side by a two-dimensional reflecting diffraction grating to internally reflect the incident light back into the active material.

7 Claims, 5 Drawing Figures

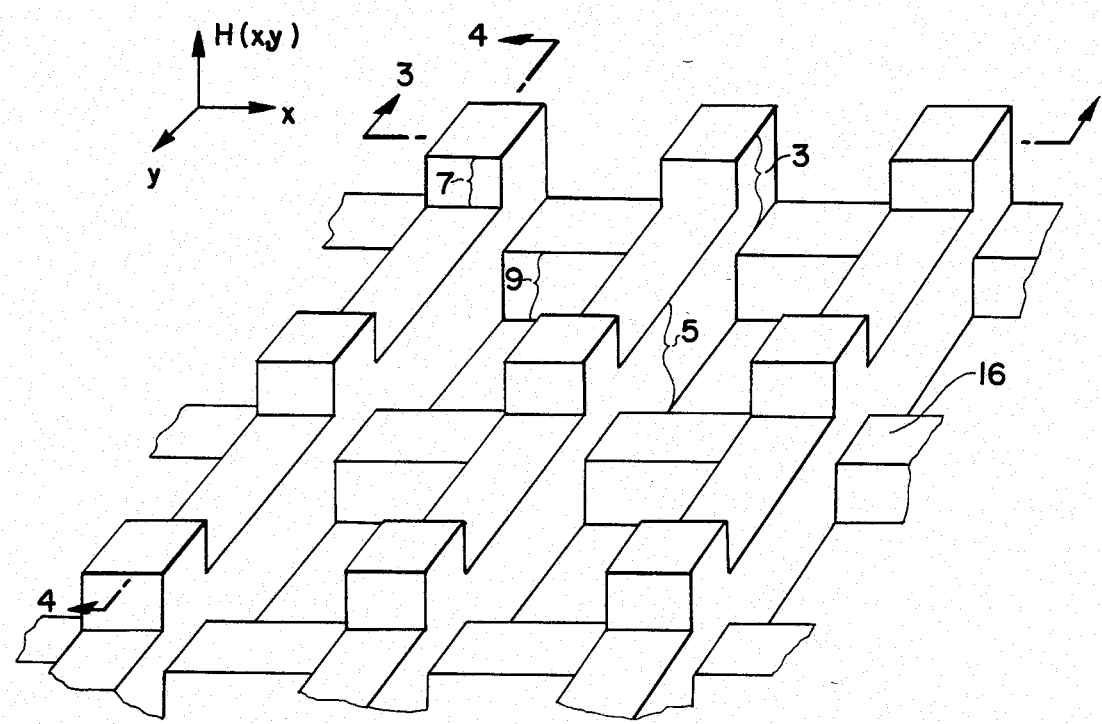
FIG. 2
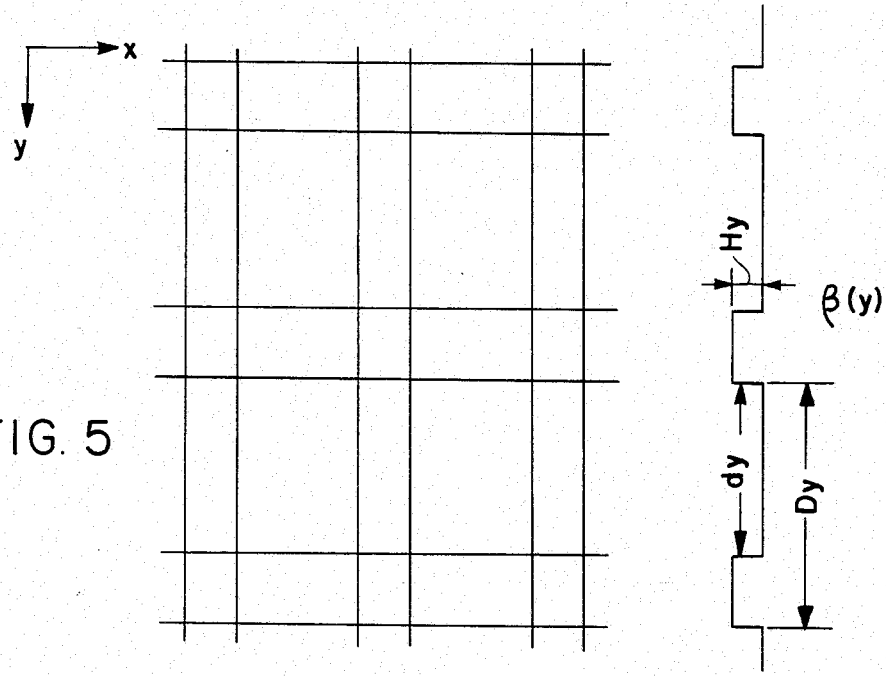
FIG. 5
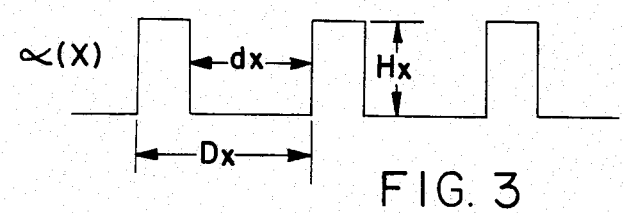
FIG. 4
FIG. 3

SOLAR CELL WITH TWO-DIMENSIONAL REFLECTING DIFFRACTION GRATING

BACKGROUND OF THE INVENTION

The present invention concerns solar cells. In particular, the present invention is a solar cell whose absorption of incident solar light is enhanced in a range of light wavelengths where the intrinsic absorption by the semiconductor is especially weak by means of a two-dimensional reflecting diffraction grating.

Many of the materials used for solar cells, such as silicon, require a thick active layer because of low absorption of incident light. In particular, silicon has low solar absorptance in the infrared and far-infrared. However, such thickness requirements impose severe purity constraints on the material. This follows because the purity of the active material determines the lifetime of the electron-hole pair that is generated by the absorbed sunlight. The lifetime of the generated pair is proportional to the square of diffusion length. The diffusion length is the average length a photo-generated carrier can travel before it recombines. Since the cell must be thick to allow for absorption of the incident sunlight, the diffusion length must be of the order of the thickness of the cell to allow for the generated pair to contribute to the electric current generated by the cell. This, in turn, requires high purity active material.

It is desirable to reduce the thickness of the active material for several reasons. First a thin layer would reduce the amount and, therefore, the cost of the active material. Second, a thin layer would allow for a reduction in the diffusion length of the generated carriers. Shorter diffusion lengths allow for a reduction in the purity of the active material as discussed above.

SUMMARY OF THE INVENTION

The invention is a solar cell including an active layer of semi-conductor material fixed to a two-dimensional reflecting diffraction grating.

The interface between the active layer and the diffraction grating is described by orthogonal periodic functions.

In a preferred embodiment, the active layer is silicon and the diffraction grating is coated with a layer of silver.

BRIEF DESCRIPTION OF THE DRAWINGS

FIG. 2 is a perspective view of a preferred embodiment of the diffraction grating according to the present invention.

FIG. 3 is a cross section of the diffraction grating of FIG. 2 taken along line 3—3.

FIG. 4 is a cross section of the diffraction grating of FIG. 2 taken along line 4—4.

FIG. 5 is a top view of the diffraction grating in FIG. 2.

DETAILED DESCRIPTION

Figure 1:
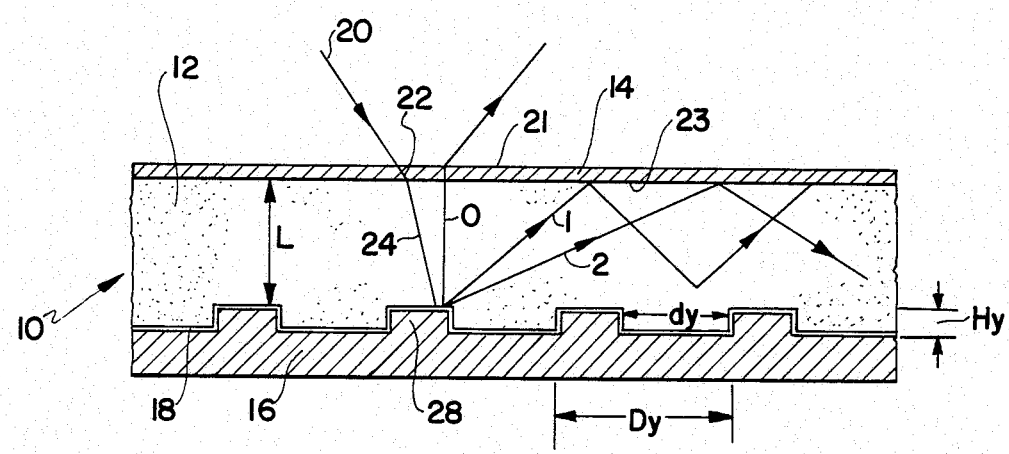
FIG. 1 is a cross-sectional view of a solar cell according to the present invention.

For purposes of description, the present invention shall be illustrated and described with respect to a solar cell whose active material is silicon. However, it is to be understood that other active materials may be used.

The present invention is a solar cell in which some of the incident light that enters the cell is converted into "guided waves" inside the active material. These guided waves travel horizontally parallel to the silicon film surface. These guided waves travel on the average, a distance inside the silicon much longer than the thickness of the silicon. This allows the thickness of the silicon to be reduced so that the active material is but a thin film. The conversion of the incident light to waves traveling horizontal to the cell surface is accomplished by a diffraction grating fixed to one surface of the active material. The diffraction grating is a two-dimensional array having two orthogonal directions (x and y) whose profile is described by periodic functions in each of the x and y directions.

FIG. 1 shows a schematic diagram of the preferred embodiment of the present invention. The diagram of FIG. 1 shows the profile of the diffraction grating solar cell in the y-direction. The profile in the x-direction has substantially the same profile shape but not necessarily the same dimensions. The solar cell 10 includes an active layer of semi-conductor material 12 of thickness L. The silicon structure may be crystalline, polycrystalline or amorphous. The surface of the silicon film 12 toward the incident light may be coated with an anti-reflection coating 14 to reduce reflection loss of the incident light. Such coatings include an evaporated layer of $SnO_2$ or $ZrO_2$ of the order of 0.07 $\mu$m thick. The surface of the silicon film 12 opposite the incident light is fixed to the reflecting diffraction grating 16. The diffraction grating 16 is coated on the side toward the incident light 20 with a reflecting material 19, preferably, silver or aluminum. However, the most preferred material is silver. The silicon film 12 is deposited on the grating by either evaporation or other thin film deposition methods. When sunlight enters the solar cell at some arbitrary angle, the light is refracted due to the higher index of refraction of the antireflection coating and silicon according to Snell's Law:

$$N \sin i = n \sin r,$$

where
N = index of refraction of first medium
n = index of refraction of second medium
i = angle with respect to the vertical of incident light
r = angle with respect to the vertical of light in second medium.

The incoming light ray 20 is refracted at each interface as it enters the solar cell. At the air-anti-reflection coating interface 21, the light ray 20 is refracted toward the vertical as ray 22 in accordance with Snell's Law since the index of refraction of the coating exceeds that of air. Again at the anti-reflection-coating silicon interface 23, the light ray 22 is refracted toward the vertical as ray 24 because the index of refraction of silicon is greater than that of the antireflection coating.

Since the silicon layer 12 is a thin film, the light (with wavelength in the red or infrared) will most likely pass through the silicon film 12 with small absorptance. As the light strikes the reflecting diffraction grating 16, it is diffracted into various diffraction orders labeled as 0, 1, and 2 etc.

The diffraction grating is a two-dimensional structure whose profile is defined by the function $H(x,y) = \alpha(x) + \beta(y)$, where $H(x,y)$ is the height of the grating measured from an arbitrary reference plane having independent x and y axis and $\alpha(x)$ and $\beta(y)$ are periodic functions in x and y, respectively. FIG. 2 shows a preferred embodiment of the diffraction grating of the present invention. The functions $\alpha(x)$ and $\beta(y)$ are periodic functions of x and y, respectively. In this case, $\alpha$ and $\beta$ are rectangular wave functions. The profiles of $\alpha$ and $\beta$ are shown in FIGS. 3 and 4, respectively. FIG. 5 shows a top view of the diffraction grating. The periods of the periodic functions $\alpha(x)$ and $\beta(y)$ are $D_x$ and $D_y$, respectively. For the rectangular square-wave functions of the preferred embodiment, the line widths of $\alpha(x)$ and $\beta(y)$ are $d_x$ and $d_y$, respectively. The grating profile as defined by $H(x,y)=\alpha(x)+\beta(y)$ necessarily results in a profile in which distance 3 equals distance 5 and distance 7 equals distance 9.

The diffracted light can be approximately considered as successive diffraction by two one-dimensional gratings, of which one has the profile $\alpha(x)$ and the other has the profile $\beta(y)$. Such approximate consideration of diffraction by two-dimensional gratings in fact becomes exact when the light wavelength $\lambda$ becomes small as compared to the grating periodicity D (see, e.g., J. W. Goodman, *Introduction to Fourier Optics*, McGraw-Hill Book Company, N.Y. 1968). However, even when $\lambda \simeq D$, such consideration is still approximately true [see, for example, P. Sheng, "Theoretical Consideraions of Optical Diffraction from RCA Video Disc Signals," *RCA Review*, Vol. 39, pp. 512–555, (1978), P. Sheng et al, "Exact eigenfunctions for square-wave gratings: Application to diffraction and surface-plasmon calculations," *Physical Review B, Vol.* 26, No. 6, p. 2907–2916, (1982)].

The diffraction grating 16 is preferably coated with silver on surface 18, which serves as the substrate on which the silicon film is deposited. This substrate may be any material on which one can easily write a grating, for example, chromium. In addition, the grating 16 may be supported by glass or quartz to add strength to the structure. The diffraction angles for the various orders are determined by the periodicity of the grating D. The intensity distribution between various orders is determined by the grating depth H of the teeth 28. Some of the diffraction orders, such as 0, will be able to exit from the silicon layer. However, many of the diffracted orders, such as 1 and 2, will strike the top interface at angles with respect to the vertical greater than the critical angle, C, and therefore will be totally reflected.

The critical angle C is determined by the following formula:

$$\sin C = \frac{1}{N_{silicon}}.$$

when it can be assumed that the index of refraction for air is 1 and $N_{silicon}$ is the index of refraction of silicon. The anti-reflection coating has no net effect on the critical angle.

The trapped diffracted orders, e.g. 1 and 2, form the "guided modes" inside the silicon layer. Of course, when the totally reflected light hits the grating again, some of it will be diffracted out of the silicon layer.

As discussed above, the mechanism for mode confinement of the incident light is that the diffracted light strike the top interface with an angle greater than the critical angle. However, all rays that exceed the critical angle cannot propagate in the silicon layer. It is well-known that for a given wavelength only rays that intersect the surface at certain angles can be confined between two parallel surfaces. Therefore, only these rays can become "guided modes"; see e.g., Theory of Dielectric Optical Waveguides, Dietrich Marcuse, Academic Press (1974).

The final equilibrium partition of the light in the x-direction is governed by the parameters $\lambda$, $d_x$, $D_x$, L and the dielectric constants of the coating and the active materials, where $\lambda$ is the wavelength of the incident light. Similar dependence is obtained for the y-direction, using $d_y$ and $D_y$. These parameters may be chosen according to the following considerations. The absorption constant of crystalline silicon for light with $\lambda \leq 0.55$ $\mu$m is large and, therefore, no absorption enhancement is needed. In addition, light with $\lambda \geq 1.1$ $\mu$m is below the band gap energy for silicon and cannot generate electron-hole pairs. Therefore, it is only necessary to increase the absorption for the light spectrum between $\lambda = 0.55$ $\mu$m and $\lambda = 1.1$ $\mu$m. The parameters of the cell and grating are chosen so as to maximize the coupling of that portion of the light spectrum between $\lambda = 0.55$ $\mu$m and $\lambda = 1.1$ $\mu$m and the conversion of incident light to horizontally-traveling guided modes.

The two dimensional grating may be nonsymmetric. That is, the grating can be designed such that the X-direction has a rectangular wave pattern with values of $d_x$, $D_x$ and $H_x$ optimized for absorption by light of one wavelength, $\lambda_x$; whereas the profile in the y-direction has a similar rectangular-wave pattern but with different values of $d_y$, $D_y$ and $H_y$ optimized for absorption by light of another wavelength, $\lambda_y$. The total combined effect of such a two-dimensional grating is better than a grating which has the same D and H values along the two orthogonal directions because its enhancement effect is now extended to a wider spectrum range of the solar light.

Another application of a non-symmetric two-dimensional grating can be found in the fact that if the solar cell is placed facing the southern sky so that the x-axis, say, is parallel to the east-west direction, then the conditions for optimizing the values of D and H in the x and y directions are different. For in the x direction it is desirable to have the best absorption enhancement averaged over all possible incident angles of the solar light, whereas in the y direction it is desirable to have only the best enhancement at a fixed angle.

Example: An amorphous silicon solar cell with a two-dimensional grating having the geometry specified below is constructed by forming the grating on a metal substrate, such as Cr, by electron beam lithography. The grating substrate is then coated with a 500 Å-thick Ag layer by evaporation. An active layer of 0.5 $\mu$m amorphous Si can then be deposited on top of this prepared substrate by the glow discharge of $SiH_4$. A 700 Å layer of $TiO_2$, or a 550 Å layer of $ZrO_2$, is evaporated on top of the amorphous silicon to act as an anti-reflection coating. The absorption of the cell with the grating substrate of the geometry specified below has been calculated where the effect of a two-dimensional diffraction grating has been subdivided into successive diffractions by two one dimensional gratings. In this case, the grating parameters in the x direction are obtained by optimizing the cell absorption averaged over all incident angles. The grating parameters in the y direction, on the other hand, are obtained by optimizing the cell absorption for a fixed angle of incident light, in this case normal incidence. With these assumptions, the optimum values of the grating parameters are given below:

$$d_x = \tfrac{1}{2}\ \mu m,\ D_x = 2.5\ \mu m,\ H_x = 0.07\ \mu m$$

$d_y = \frac{1}{2}$ μm, $D_y = 0.6$ μm, $H_y = 0.14$ μm.

What is claimed is:
1. A solar cell comprising:
   (a) an active layer of semiconductor material having a pair of opposed surfaces,
   (b) a two-dimensional diffraction grating fixed to one of said surfaces of said active layer, coated with a layer of reflecting material at the interface between said grating and said active material, the profile of the interface between said grating and said active layer being described by $H(x,y) = \alpha(X) + \beta(y)$ where $H(x,y)$ is the height of the grating measured from a reference plane having independent x and y axes and $\alpha(x)$ and $\beta(y)$ are periodic rectangular-wave functions in x and y, respectively.
2. The solar cell of claim 1 wherein the two-dimensional diffraction grating is non-symmetric.
3. The solar cell of claim 1 wherein $\alpha(x)$ and $\beta(y)$ are square-wave functions in x and y.
4. The solar cell of claim 1 wherein said active layer is silicon.
5. The solar cell of claim 4 wherein said reflecting material is silver.
6. The solar cell of claim 4 wherein said silicon is amorphous silicon.
7. The solar cell of claim 1 wherein said reflecting material is silver or aluminum.

* * * * *